United States Patent
Kawajiri et al.

(10) Patent No.: US 10,416,255 B2
(45) Date of Patent: Sep. 17, 2019

(54) MAGNETIC RESONANCE IMAGING APPARATUS AND GRADIENT POWER SUPPLY APPARATUS

(71) Applicant: TOSHIBA MEDICAL SYSTEMS CORPORATION, Otawara-shi (JP)

(72) Inventors: Sho Kawajiri, Nasushiobara (JP); Naoyuki Furudate, Otawara (JP); Yutaka Machii, Nasushiobara (JP)

(73) Assignee: Canon Medical Systems Coprporation, Otawara-shi (JP)

(*) Notice: Subject to any disclaimer, the term of this patent is extended or adjusted under 35 U.S.C. 154(b) by 298 days.

(21) Appl. No.: 15/360,154

(22) Filed: Nov. 23, 2016

(65) Prior Publication Data
US 2017/0153307 A1    Jun. 1, 2017

(30) Foreign Application Priority Data
Nov. 27, 2015 (JP) .................. 2015-232243

(51) Int. Cl.
*G01R 33/385* (2006.01)

(52) U.S. Cl.
CPC ..... *G01R 33/3856* (2013.01); *G01R 33/3852* (2013.01)

(58) Field of Classification Search
CPC .................. G01R 33/3852; G01R 33/3856
See application file for complete search history.

(56) References Cited

U.S. PATENT DOCUMENTS

| | | | |
|---|---|---|---|
| 2011/0109316 A1* | 5/2011 | Akita | G01R 33/3607 324/322 |
| 2013/0009641 A1 | 1/2013 | Hori et al. | |
| 2013/0278267 A1 | 10/2013 | Hori et al. | |
| 2014/0300362 A1* | 10/2014 | Kawajiri | A61B 5/055 324/322 |
| 2017/0045595 A1 | 2/2017 | Machii et al. | |

FOREIGN PATENT DOCUMENTS

| | | |
|---|---|---|
| JP | 2009-240526 | 10/2009 |
| JP | 2013-17811 | 1/2013 |
| JP | 2013-236912 | 11/2013 |
| JP | 2014-30714 | 2/2014 |
| JP | 2017-035305 A1 | 2/2017 |

* cited by examiner

*Primary Examiner* — Patrick Assouad
*Assistant Examiner* — Haidong Zhang
(74) *Attorney, Agent, or Firm* — Oblon, McClelland, Maier & Neustadt, L.L.P.

(57) ABSTRACT

According to one embodiment, a magnetic resonance imaging apparatus includes a gradient coil, power supply circuitry, and control circuitry. The gradient coil generates a gradient magnetic field. The power supply circuitry supply power to the gradient coil, the power being required by the gradient. The control circuitry temporarily change an upper limit value of power to be supplied by the power supply circuitry to a second value higher than a first value as a rated value based on the power required by the gradient coil.

11 Claims, 9 Drawing Sheets

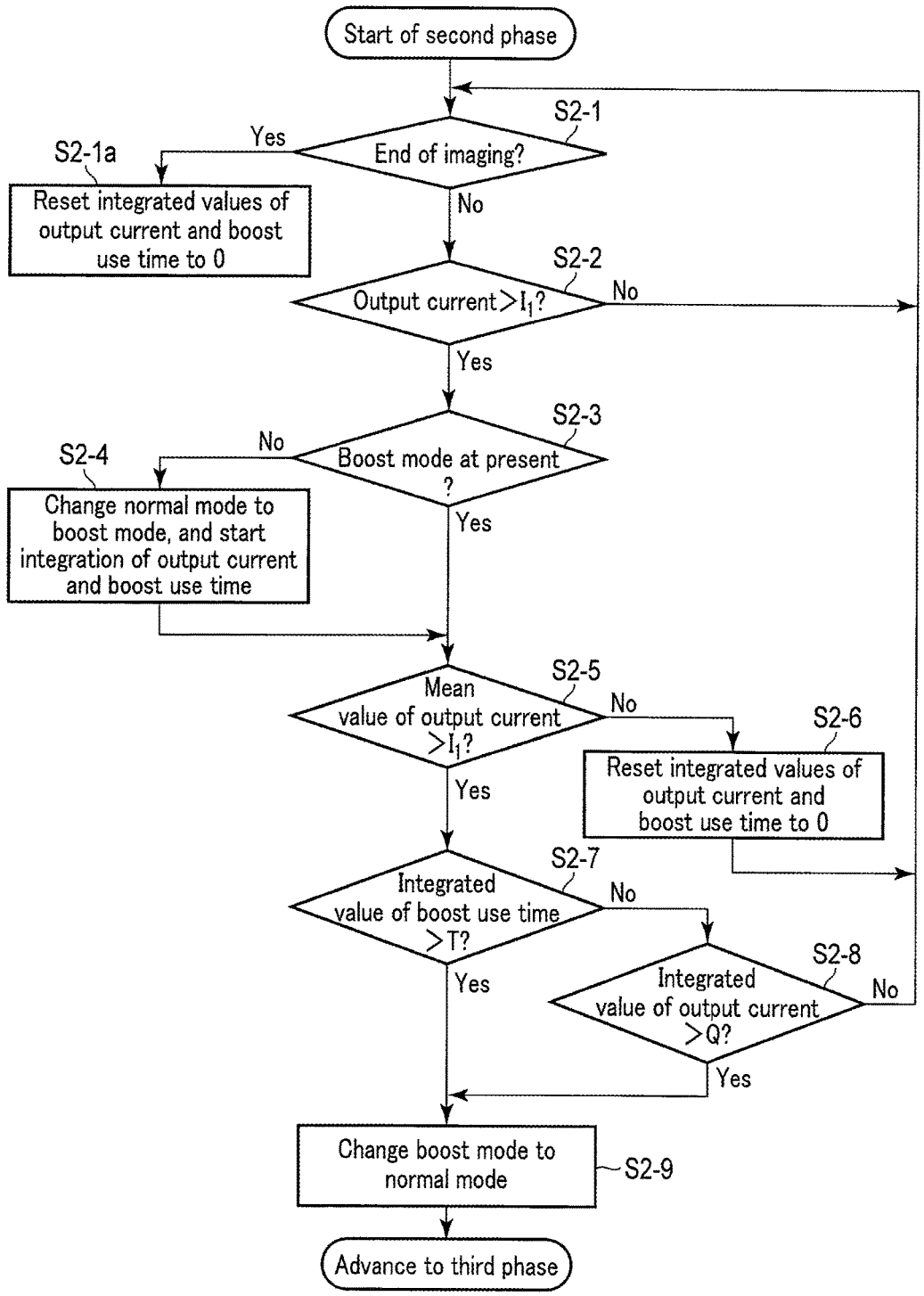
F I G. 4B

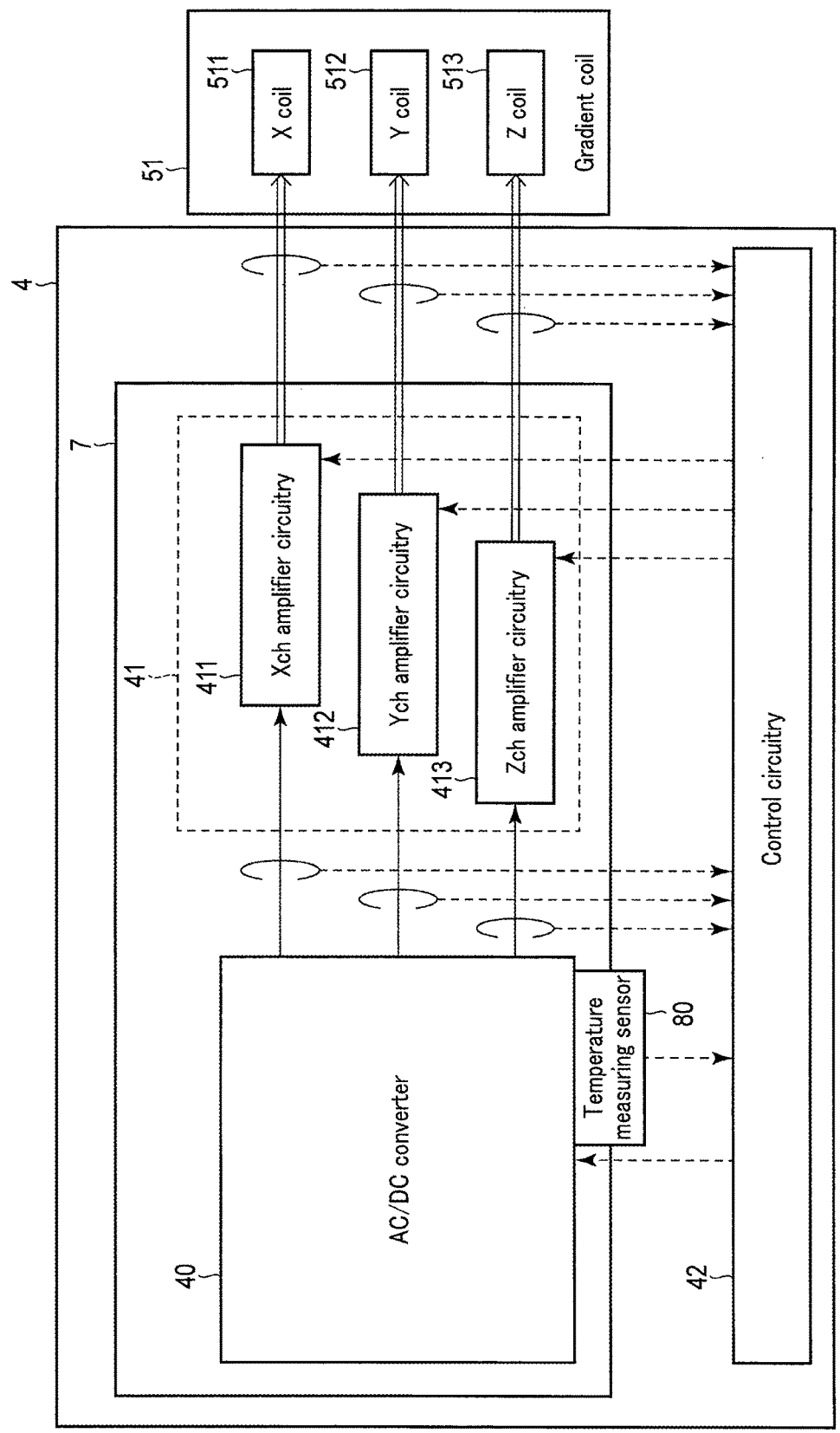
F I G. 7

MAGNETIC RESONANCE IMAGING APPARATUS AND GRADIENT POWER SUPPLY APPARATUS

CROSS-REFERENCE TO RELATED APPLICATIONS

This application is based upon and claims the benefit of priority from the prior Japanese Patent Application No. 2015-232243, filed Nov. 27, 2015, the entire contents of which are incorporated herein by reference.

FIELD

Embodiments described herein relate generally to a magnetic resonance imaging apparatus and a gradient power supply apparatus.

BACKGROUND

Magnetic resonance imaging (MRI) apparatuses are widely used in the field of medical imaging diagnosis. The MRI is an imaging method based on a magnetic resonance phenomenon. In the MRI apparatus, an atomic nucleus (e.g. 1H) spin, which is included in a subject placed in a space where a static magnetic field is generated, is magnetically excited by an RF (Radio Frequency) signal of a Larmor frequency, and a magnetic resonance imaging image is reconstructed from a magnetic resonance (MR) signal which occurs due to the excitation.

The magnetic resonance imaging apparatus includes a gradient power supply unit which supplies power to a gradient coil that generates a gradient magnetic field. The gradient power supply unit supplies power to the gradient coil in accordance with an imaging condition which is executed.

BRIEF DESCRIPTION OF THE DRAWINGS

FIG. 4B is a flowchart illustrating a second phase in the flow of the process relating to the boost control function which the gradient power supply apparatus includes, in the magnetic resonance imaging apparatus according to the embodiment.

FIG. 7 is a block diagram illustrating the configuration of a gradient power supply apparatus in a third modification of the embodiment.

DETAILED DESCRIPTION

Figure 1:
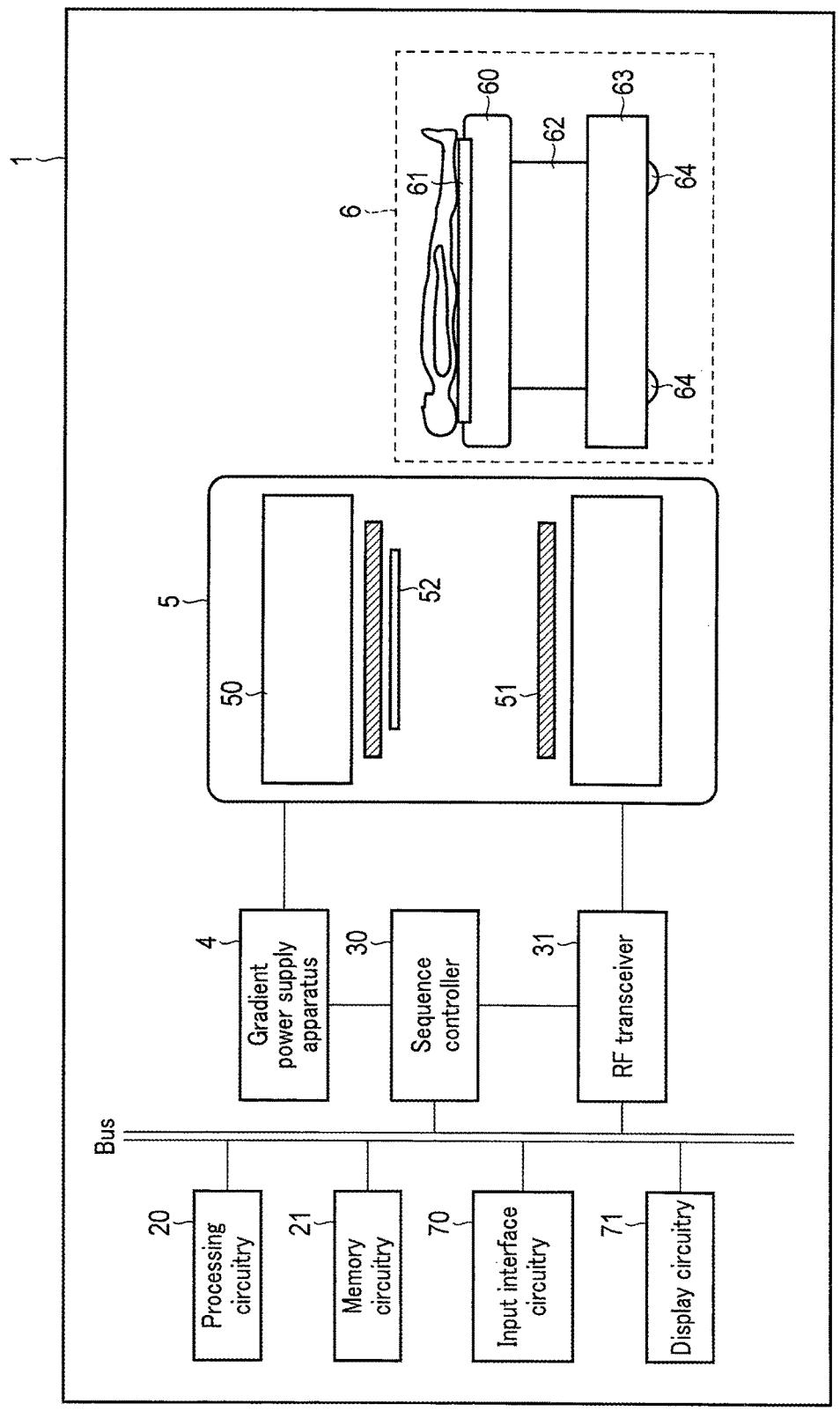
FIG. 1 is a block diagram illustrating the configuration of a magnetic resonance imaging apparatus according to an embodiment.

In general, according to one embodiment, a magnetic resonance imaging apparatus includes a gradient coil, power supply circuitry, and control circuitry. The gradient coil generates a gradient magnetic field. The power supply circuitry supply power to the gradient coil, the power being required by the gradient. The control circuitry temporarily change an upper limit value of power to be supplied by the power supply circuitry to a second value higher than a first value as a rated value based on the power required by the gradient coil.

Hereinafter, an embodiment will be described with reference to the accompanying drawings. In the description below, structural elements having substantially the same function and structure are denoted by like reference numerals, and an overlapping description is given only where necessary.

FIG. 1 is a block diagram illustrating the configuration of a magnetic resonance imaging apparatus 1 according to an embodiment.

The magnetic resonance imaging apparatus 1 includes processing circuitry 20 (processing means), memory circuitry 21, a sequence controller 30, an RF transceiver 31, a gradient power supply apparatus 4, a gantry 5, a couch 6, input interface circuitry 70, and display circuitry 71 (display means).

The processing circuitry 20 executes processing/control of the entire operation relating to the magnetic resonance imaging apparatus 1 according to the embodiment. The processing circuitry 20 is, for example, a central processing unit (CPU) which is not illustrated. By reading out a predetermined program stored in the memory circuitry 21, the processing circuitry 20 realize, for example, functions relating to magnetic resonance imaging, such as a data acquisition function and an image reconstruction function. In particular, by reading out and executing a predetermined program stored in the memory circuitry 21, the processing circuitry 20 realize a determination function, an alert display function and an optimization function, which will be described later.

In the meantime, in FIG. 1, one processing circuitry 20 is illustrated. However, actually, the processing circuitry 20 may be implemented as one processing circuit 20 or may be implemented so as to include a plurality of processing circuits for the respective functions. In addition, the processing circuitry 20 may be a combination of such plural processing circuits.

The memory circuitry 21 store, for example, a protocol relating to magnetic resonance imaging, a plurality of parameters included in the protocol, a combination of values of these parameters, examination information relating to a subject, magnetic resonance imaging images, and programs for realizing the respective functions by the processing circuitry 20. However, these are merely examples, and the restriction to these examples is unnecessary. Here, the combination of the values of the parameters is, for example, an imaging condition. The examination information relating to the subject is, for example, the date/time of an examination, patient number (ID), gender, name, date of birth, body height, body weight, parts for examination, direction of insertion, body posture, a reception coil to be used, the mounting position of the reception coil, the presence/absence and kind of biological signals, and the use/non-use and kind of contrast medium. The respective functions are, for example, a data acquisition function, an image reconstruction function, a determination function, an alert display function, and an optimization function.

The memory circuitry 21 is implemented, for example, as a storage device such as a hard disk drive (HDD) or solid state drive (SDD). In addition, the memory circuitry 21 is also implemented as a memory, such as a random access memory (RAM), which stores temporarily necessary information relating to arithmetic operations of programs. Here, the temporarily necessary information relating to arithmetic operations of programs is, for example, an augment, array, structure, etc.

The sequence controller 30 is connected to the RF transceiver 31 and gradient power supply apparatus 4, and controls sequences relating to transmission of an electric signal for generating a gradient magnetic field, and transmission/reception of an electric signal for generating RF pulses. Specifically, the sequence controller 30 transmits triggers to the respective connection destinations at a predetermined timing.

The RF transceiver 31 transmits an electric signal, which causes an RF coil 52 in the gantry 5 to generate RF pulses, to the RF coil 52 via amplifier circuitry (not shown) or the like. At this time, the RF coil 52 functions as a transmission coil. In addition, the RF transceiver 31 receives, via amplifier circuitry (not shown) or the like, an MR signal which the RF coil 52 in the gantry 5 has received. At this time, the RF coil 52 functions as a reception coil. Incidentally, the RF coil 52 is not restricted to the mode illustrated in FIG. 1 in which the RF coil 52 is provided within the gantry 5. For example, a local coil for reception, or a local coil for transmission/reception, which is provided in the couch 6 or near the subject, is included. The local coil is, for instance, a coil for the head, or a coil for the abdomen.

The gradient power supply apparatus 4 applies a voltage to a gradient coil 51 in the gantry 5, in response to a trigger input by the sequence controller 30. Incidentally, the gradient power supply apparatus 4 will be described later in detail with reference to FIG. 2.

The couch 6 includes a table unit 60, a couch top 61, an elevation mechanism 62, a base 63, and casters 64. As illustrated in FIG. 1, the couch 6 is a bed (dockable bed) which is attachable/detachable to/from the gantry 5 and is movable. However, this is merely an example, and the restriction to this is unnecessary. For example, the magnetic resonance imaging apparatus 1 according to the embodiment may be implemented by using the couch 6 which is fixed in an imaging room.

The table unit 60 includes the couch top 61 at the upper part thereof. A subject is placed on the couch top 61. The couch top 61 is driven, for example, by an electromagnetic motor (not shown), and horizontally moves in the longitudinal direction.

The elevation mechanism 62 is provided on an upper part of the base 63. The elevation mechanism 62 is driven, for example, by an electromagnetic motor (not shown), and vertically moves. Specifically, the height of the table unit 60 and couch top 61 is adjusted, as needed, in accordance with the vertical movement of the elevation mechanism 62.

The base 63 supports the above-described elevation mechanism 62, and includes the casters 64.

The caster 64 includes a bearing (not shown) and a wheel. By using the casters 64, an operator, such as a doctor, moves the couch 6. In addition, with use of the casters 64 to which driving power is supplied by, for example, an electromagnetic motor (not shown), the movement of the couch 6 using the driving power, or the assist (power assist) of movement, may be implemented.

The gantry 5 includes a static-field magnet 50, the gradient coil 51 and the RF coil 52.

The static-field magnet 50 has a hollow, substantially circular cylindrical shape, and generates a static field within the substantially circular cylinder. In the magnetic resonance imaging apparatus 1 according to the embodiment, it is assumed that the static-field magnet 50 is a superconducting magnet. However, the static-field magnet 50 is not restricted to the superconducting magnet, and may be implemented by using a permanent magnet or a normal conduction magnet.

The gradient coil 51 is a coil unit which is attached to the inside of the static-field magnet 50 and is formed in a hollow, substantially circular cylindrical shape. The gradient coil 51 generates a desired gradient magnetic field, in response to an input from the amplifier circuitry in the gradient power supply apparatus 4.

Although depiction is omitted in FIG. 1 for the purpose of simple illustration, the gradient coil 51 is actually formed such that three coils corresponding to X, Y and Z axes, which are perpendicular to each other, are combined. These three coils are referred to as an X coil 511, a Y coil 512 and a Z coil 513, respectively. The three coils form gradient magnetic fields, which vary in field intensity, along the X, Y and Z axes. In addition, the three coils are examples of axis coils recited in the patent claims.

The formed gradient magnetic fields of the X, Y and Z axes constitute, for example, a slice selection gradient field Gs, a phase encode gradient field Ge, and a read-out gradient field Gr. The slice selection gradient field Gs is utilized in order to arbitrarily determine an imaging cross section. The phase encode gradient field Ge is utilized in order to vary the phase of a magnetic resonance signal in accordance with a spatial position. The read-out gradient field Gr is utilized in order to vary the frequency of a magnetic resonance signal in accordance with a spatial position.

The RF coil 52 transmits RF pulses to the subject in response to an input of an electric signal which was output from the RF transceiver 31 and was amplified in the amplifier circuitry (not shown). The RF pulse excites an atomic nucleus of the subject, which corresponds to a characteristic Larmor frequency. In addition, the RF coil 52 receives an MR signal which is generated when the atomic nucleus in the subject restores from the excited state to the original state, and transmits an electric signal based on the MR signal to the RF transceiver 31 via the amplifier circuitry (not shown).

In the meantime, although the transmission/reception of RF pulses is implemented by one coil in the magnetic resonance imaging apparatus 1 according to the embodiment, the restriction to this example is unnecessary. For example, the transmission and reception may be implemented by two coils, respectively.

The amplifier circuitry (not shown) amplify a voltage which is supplied from power supply circuitry (not shown), and transmit to the RF coil 52 in the gantry 5 an electric signal for causing the RF coil 52 to generate the RF pulse for exciting the atomic nucleus which the subject includes. Thereafter, responding to the input of the electric signal from this amplifier circuitry, the RF coil 52 transmits the RF pulses to the subject. The RF pulse excites the atomic nucleus of the subject, which corresponds to the characteristic Larmor frequency.

Then, upon being triggered by the reception of the electric signal, the processing circuitry 20 read out and executes a predetermined program relating to the data acquisition function, which is stored in the memory circuitry 21, thereby storing the electric signal in the memory circuitry 21 (data acquisition function). Further, the processing circuitry 20 read out and executes a predetermined program relating to the image reconstruction function, thereby executing an arithmetic operation of Fourier transform on the MR signal stored in the memory circuitry 21, and generating a magnetic resonance imaging image (MRI image) from the MR signal (image reconstruction function).

The input interface circuitry 70 is realized by, for example, a user interface such as a switch button, a mouse or a keyboard, and accepts an instruction of the operator such as a doctor. The instruction is transferred to the processing circuitry 20. In accordance with the instruction, the processing circuitry 20 executes a predetermined control or arithmetic operation.

The display circuitry 71 displays a screen of a graphical user interface (GUI). The display circuitry 71 is implemented, for example, as a display device such as a CRT display, a liquid crystal display, an organic EL display, a plasma display, etc. Responding to a predetermined control by the processing circuitry 20, this display device displays, for example, a magnetic resonance imaging image stored in the memory circuitry 21 on the screen of the GUI. Alternatively, in association with the display circuitry 71, a printer (not shown), which can print, for example, a display screen on the display device, may be used as needed. Incidentally, the display circuitry 71 is an example of display means.

In the meantime, the magnetic resonance imaging apparatus 1 according to the embodiment may be implemented so as to include a read/write unit (not shown) which reads storage media or writes information in storage media. The storage media may be any media, if the storage media is removable media. For example, when the storage media is optical media (CD: Compact Disc, DVD: Digital Versatile Disc, etc.), the read/write unit is implemented as an optical drive. Alternatively, when the storage media is magneto-optical media (MO disc: Magneto-Optical Disc), the read/write unit is implemented as a magneto-optical drive.

The read/write unit can move or copy a magnetic resonance imaging image, which is stored in the memory circuitry 21, to storage media. In addition, the read/write unit can move or copy a magnetic resonance imaging image, which is stored in the storage media, to the memory circuitry 21.

Figure 2:
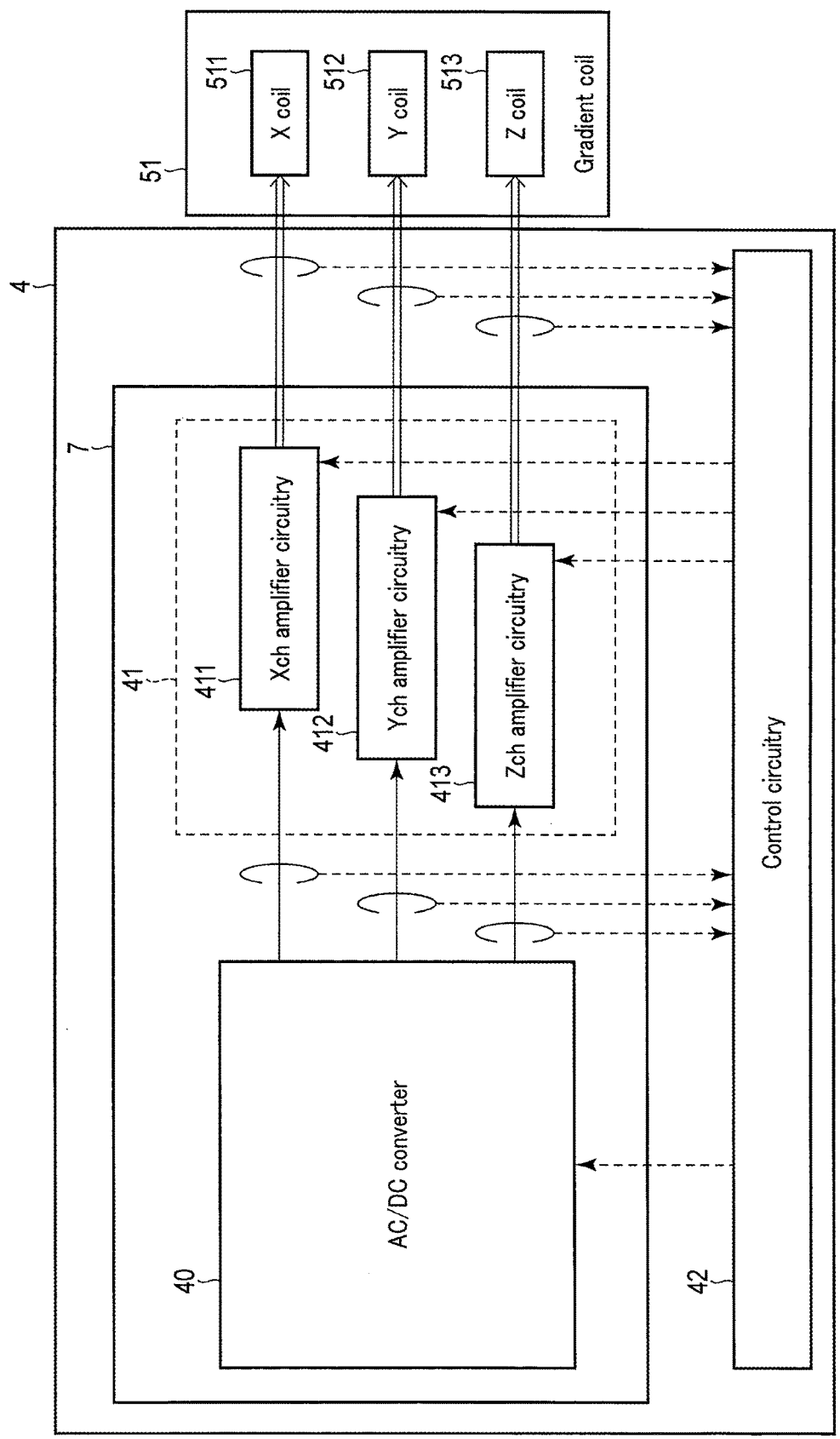
FIG. 2 is a block diagram illustrating the configuration of a gradient power supply apparatus which the magnetic resonance imaging apparatus according to the embodiment includes.

FIG. 2 is a block diagram illustrating the configuration of the gradient power supply apparatus 4 which the magnetic resonance imaging apparatus 1 according to the embodiment includes. In FIG. 2, solid-line arrows indicate power lines, double-line arrows indicate output lines, and broken-line arrows indicate communication signal lines.

The gradient power supply apparatus 4 includes an AC/DC converter 40, amplifier circuitry 41, and control circuitry 42. The amplifier circuitry 41 includes Xch amplifier circuitry 411, Ych amplifier circuitry 412, and Zch amplifier circuitry 413 in association with respective channels. Power supply circuitry 7 includes, for example, the AC/DC converter 40, and amplifier circuitry 41. The power supply circuitry 7 supply a required power, which is required by the gradient coil 51, to the gradient coil 51.

The AC/DC converter 40 converts an AC (Alternating Current) voltage, which is supplied from installation equipment (e.g. a dedicated outlet), to DC (Direct Current) voltages of a plurality of insulated channels.

The AC/DC converter 40 is implemented, for example, so as to divide an AC voltage, which is supplied from the installation equipment, into a plurality of channels by a transformer (not shown), and to rectify the transformed AC voltages by a rectifier (not shown), thereby obtaining DC voltages of the plural channels. Alternatively, the AC/DC converter 40 is implemented, for example, so as to rectify an AC voltage, which is supplied from the installation equipment, thereby obtaining a DC voltage, and then to obtain DC voltages of plural channels by using a DC/DC converter (not shown). More in general, it is preferable that the AC/DC converter 40 is implemented by using an IC (integrated circuit) or an LSI (large-scale integration), in which the present function is integrated. However, these are merely examples, and the restriction to these examples is unnecessary.

In addition, the AC/DC converter 40 applies the DC voltages to the Xch amplifier circuitry 411, Ych amplifier circuitry 412 and Zch amplification circuitry 413.

The amplifier circuitry 41 arbitrarily amplifies the DC voltages which are supplied by the AC/DC converter 40, and apply the arbitrary amplified voltages to the gradient coils 51 of the corresponding channels. In other words, the Xch amplifier circuitry 411 apply the arbitrary amplified voltage to the X coil 511 in the gradient coil 51, which corresponds to the X axis. The Ych amplifier circuitry 412 applies the arbitrary amplified voltage to the Y coil 512 in the gradient coil 51, which corresponds to the Y axis. The Zch amplifier circuitry 413 applies the arbitrary amplified voltage to the Z coil 513 in the gradient coil 51, which corresponds to the Z axis.

In the meantime, the amplifier circuitry 41 may be implemented such that the amplifier circuitry 41 is shared by plural channels, and the channels are switched when necessary.

The control circuitry 42 includes at least a processor and a memory, which are not illustrated. The control circuitry 42 executes, where necessary, a boost control function (a boost control program) in the gradient power supply apparatus 4, and small functions (small programs) relating to the boost control function (the boost control program). The boost control program will be described later. In the meantime, as illustrated in FIG. 2, in the magnetic resonance imaging apparatus 1 according to the embodiment, the control circuitry 42 is a single control circuit 42. However, this is merely an example, and the restriction to this example is unnecessary. For example, the control circuitry 42 may be implemented so as to include a plurality of control circuits which are different in association with small programs.

The control circuitry 42 limits an output current which is output from the AC/DC converter. For example, the control circuitry 42 monitors at least one output current which is output from the AC/DC converter. The control circuitry 42 control a voltage value of a voltage which is amplified via the amplifier circuitry 41 and is applied to each gradient coil 51. The control circuitry 42 monitor a current corresponding to the voltage applied to each gradient coil 51. The above-described program executed by the control circuitry 42 is merely an example, and the restriction to this example is unnecessary.

Boost Control Function

The magnetic resonance imaging apparatus 1 according to the embodiment includes a boost function of temporarily supplying a large current or power from the AC/DC converter 40. In addition, the magnetic resonance imaging apparatus 1 according to the embodiment includes a boost control function relating to the comprehensive control of a timing of using the boost function, etc.

Figure 3:
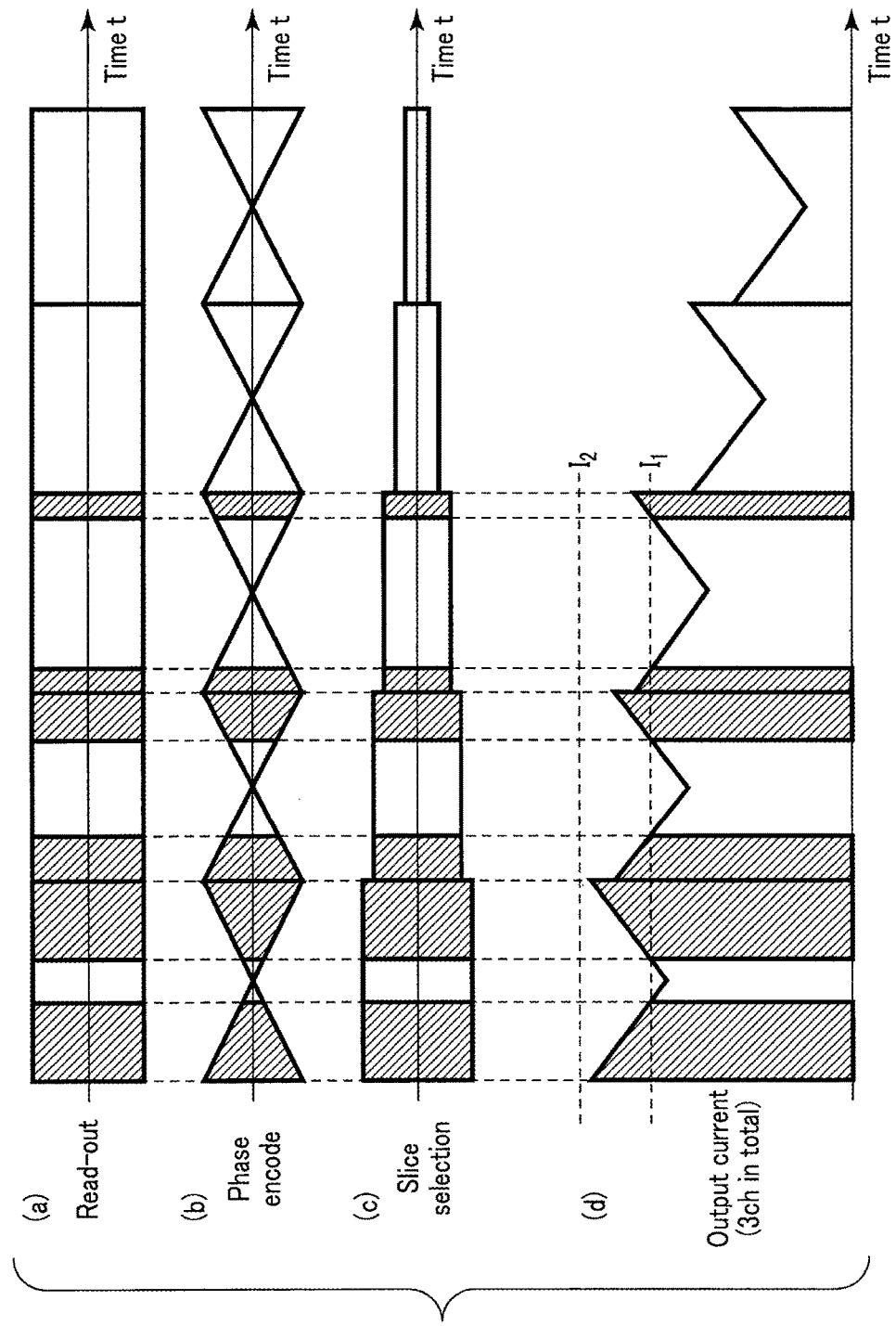
FIG. 3 is a timing chart illustrating an example of three-dimensional scan, FIG. 3 being a timing chart for describing a boost function of the magnetic resonance imaging apparatus according to the embodiment.

FIG. 3 is a timing chart illustrating an example of three-dimensional scan, FIG. 3 being a timing chart for describing the boost function of the magnetic resonance imaging apparatus 1 according to the embodiment.

Part (a) of FIG. 3 illustrates an output current in a read-out direction. Part (b) of FIG. 3 illustrates an output current in a phase encode direction. Part (c) of FIG. 3 illustrates an output current in a slice selection direction. Part (d) of FIG. 3 illustrates a timing chart relating to a total value of output currents which the AC/DC converter 40 outputs.

As illustrated in FIG. 3, when three-dimensional imaging is executed, power is supplied to the gradient coil 51 with respect to the three phases of the read-out direction, phase encode direction and slice selection direction. In particular, depending on positions of imaging, a large power is required. Here, the position of imaging corresponds to, for example, a predetermined timing in an imaging sequence. Hatched parts in FIG. 3 indicate timings at which the total value of output currents, which are output from the AC/DC converter 40, exceeds a current threshold $I_1$ (to be described later). Specifically, the hatched parts in FIG. 3 indicate timings at which the sum of powers corresponding to the three phases exceeds a power threshold $P_1$ (to be described later).

In this case, in a magnetic resonance imaging apparatus according to one conventional technique, the output current is limited to $I_1$ (limiter function). On the other hand, in the magnetic resonance imaging apparatus 1 according to the embodiment, the output of the current exceeding the current threshold $I_1$ is temporarily permitted by using the boost function as illustrated in FIG. 3. In other words, the current threshold $I_1$ is temporarily changed to a new current threshold $I_2$ which is higher than $I_1$.

Figure 4A:
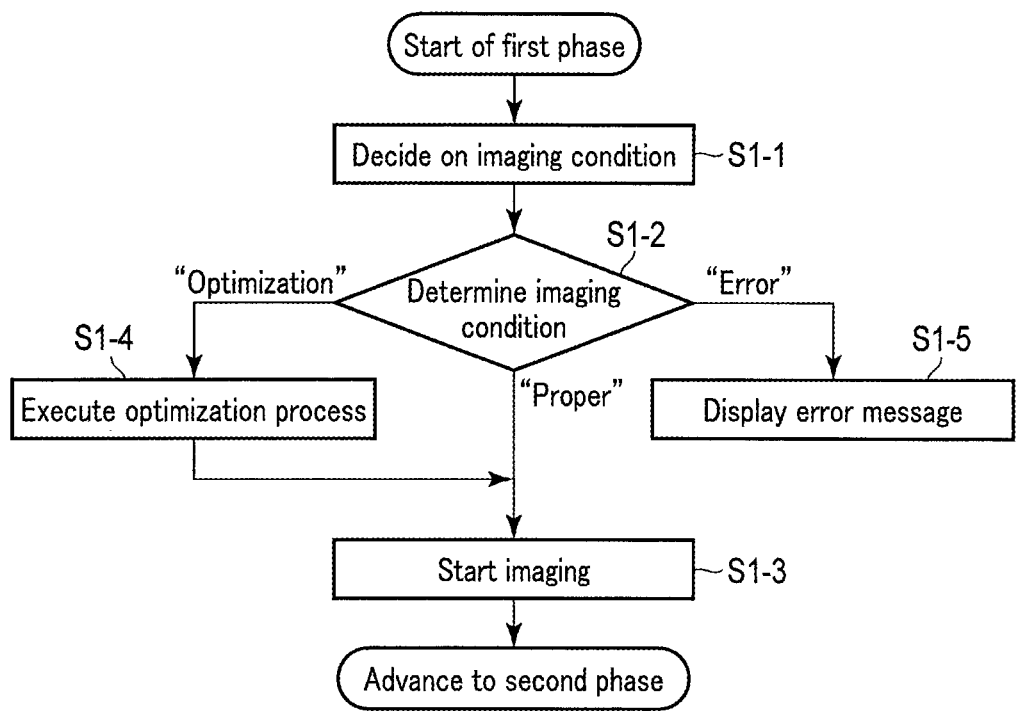
FIG. 4A is a flowchart illustrating a first phase in the flow of a process relating to a boost control function which the gradient power supply apparatus includes, in the magnetic resonance imaging apparatus according to the embodiment.
Figure 4C:
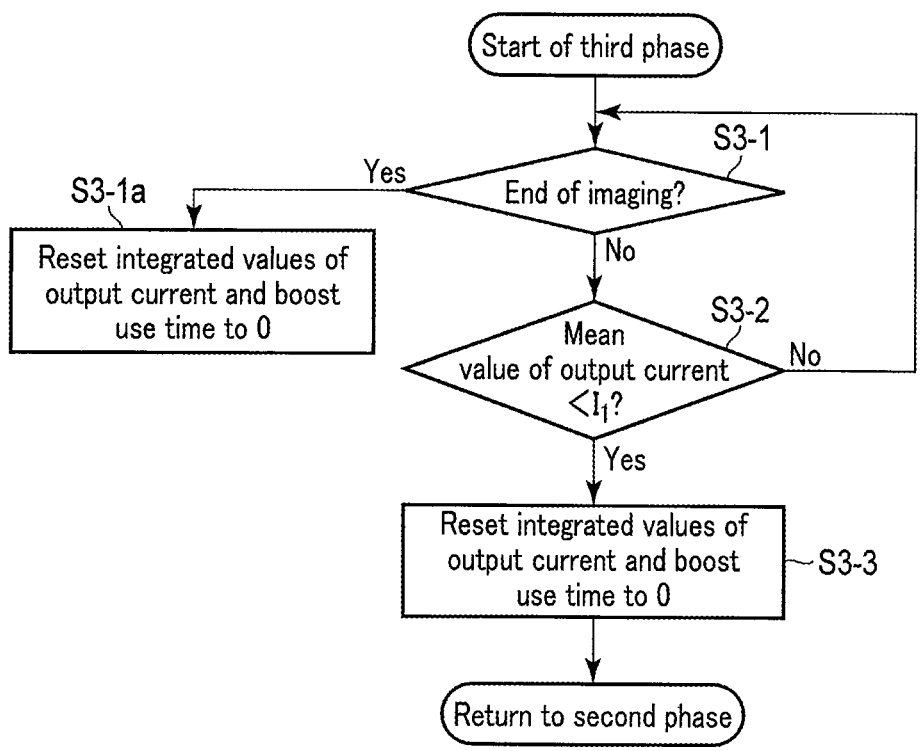
FIG. 4C is a flowchart illustrating a third phase in the flow of the process relating to the boost control function which the gradient power supply apparatus includes, in the magnetic resonance imaging apparatus according to the embodiment.

FIG. 4A, FIG. 4B and FIG. 4C are flowcharts for describing the flow of a process relating to the boost control function which the gradient power supply apparatus 4 includes, in the magnetic resonance imaging apparatus 1 according to the embodiment. Hereinafter, the boost control function will be described in detail with reference to the respective process steps in FIG. 4A, FIG. 4B and FIG. 4C.

First Phase

Steps S1-1 to S1-5 in FIG. 4A illustrate a first phase relating to the boost control function, the first phase being a phase prior to the start of imaging. The respective steps will be described below.

Step S1-1

An operator such as a doctor, that is, a user of the present magnetic resonance imaging apparatus 1, inputs, through the input interface circuitry 70, an imaging condition for executing a desired imaging sequence relating to magnetic resonance imaging. The input imaging condition is temporarily stored in the memory circuitry 21. Then, the process advances to step S1-2.

Step S1-2

The processing circuitry 20 read out and, executes the imaging condition stored in the memory circuitry 21 in step S1-1, and a predetermined program which is prestored, thereby determining whether this imaging condition is proper or not (determination function). This predetermined program corresponds to, for example, an imaging condition determination instruction. The processing circuitry 20, which realize the determination function, estimate, for example, an output power of the gradient power supply, based on the imaging condition, and determine whether imaging under this imaging condition is executable or not. In addition, by estimating the output power of the gradient power supply, based on the imaging condition, the processing circuitry 20 determine a timing at which the boost function (to be described later) becomes usable. By estimating the output power of the gradient power supply, based on the imaging condition, the processing circuitry 20 determine whether a boost use time, which is a time of use of the boost function (to be described later), is too long or not.

Specifically, based on the imaging condition, the processing circuitry 20 estimate, before starting imaging, at least one of the power required by the gradient coil, a time when the upper limit value is permitted to be changed, and a duration of time when the upper limit value is set to the second value.

The processing circuitry 20, which realize the determination function, determine "proper", if the imaging can be started without changing the imaging condition. At this time, the next process is step S1-3. In addition, the processing circuitry 20 determines "optimization", if the imaging condition needs to be changed in order to start imaging. At this time, the next process is S1-4. Further, the processing circuitry 20 determines "error", when imaging cannot be started even if the imaging condition is changed. At this time, the next process is step S1-5. In short, the processing circuitry 20, which realize the determination function, generates three determination results in accordance with the imaging condition.

Step S1-3

If "proper" is determined in the determination in step S1-2, the processing circuitry 20 read out and execute a predetermined program stored in the memory circuitry 21. Here, the predetermined program corresponds to, for example, an imaging start instruction. Thereby, the imaging by the magnetic resonance imaging apparatus 1 is started. At this time, the next process is a second phase.

Step S1-4

If "optimization" is determined in the determination in step S1-2, the processing circuitry 20 reads out and execute a predetermined program stored in the memory circuitry 21, thereby optimizing the imaging. The processing circuitry 20, which realize the optimization function, changes the imaging condition, for example, by rearranging the imaging protocol. At this time, the process of step S1-1 is executed once again. Thereby, a "proper" imaging condition is automatically determined without changing the basic outline of the imaging. Next, the process of step S1-3 is executed. Specifically, the processing circuitry 20 optimizes an imaging sequence related to the imaging condition based on the estimation in step S1-2.

Step S1-5

If "error" is determined in the determination in step S1-2, the processing circuitry 20 reads out and execute a predetermined program stored in the memory circuitry 21. Here, the predetermined program corresponds to, for example, an error message display instruction. Thereby, the display circuitry 71 displays an error message to the effect that the imaging condition is not proper (alert display function). At this time, the process of the first phase ends. Here, the error message is, for example, information by characters or graphics for alerting the user. Specifically, based on the estimation result in step S1-2, the processing circuitry 20 controls a display to display an alert based on the estimation.

Second Phase

Steps S2-1 to S2-9 in FIG. 4B illustrate a second phase relating to the boost control function, the second phase being a phase during the imaging. As will be described later, the second phase includes a loop process. In the second phase, the control circuitry 42 monitors, with a higher time resolution than the processing circuitry 20, the output currents which are output from the AC/DC converter 40, and the output currents which are output from the Xch amplifier circuitry 411, Ych amplifier circuitry 412 and Zch amplification circuitry 413 in the amplifier circuitry 41. At this time, monitoring means is realized as a monitoring function of the control circuitry 42. In the meantime, the monitoring means may monitor a power index value corresponding to a current or power which is supplied from the amplifier circuitry 41 to at least one axis coil of a plurality of axis coils, which correspond to the X coil 511, Y coil 512 and Z coil 513. For example, the control circuitry 42 monitor the power to be supplied by the power supply circuitry 7, and power to be supplied to at least one of a plurality of axis coils, the axis coils being included by the gradient coil. In addition, based on the monitoring result, the control circuitry 42 executes, where necessary, various small functions relating to the boost control function.

For example, based on the monitoring result, the control circuitry 42 releases the limitation to the output power of the AC/DC converter 40. In other words, based on the monitoring result, the control circuitry 42 changes a normal mode to a boost mode. The normal mode is a mode in which the output current is limited to the current threshold $I_1$. The boost mode is a mode in which the output current is limited to the current threshold $I_2$ which is higher than the current threshold $I_1$.

In the meantime, the normal mode may be a mode in which the output power is limited to a power threshold $P_1$. In addition, the boost mode may be a mode in which the output power is limited to a power threshold $P_2$ which is higher than the power threshold $P_1$. For example, in accordance with required power which is required by the gradient coil 51, the control circuitry 42 temporarily changes the upper limit value of power, which is set in the power supply circuitry 7, to a second value which is higher than a first value that is a rated value. Based on another monitoring result, the control circuitry 42 forcibly terminate the boost mode, where necessary (boost mode restriction function). At this time, upper limit value control means is realized by the control circuitry 42, for example, as a function of releasing the limitation to the output current or output voltage. Specifically, the control circuitry 42 changes the upper limit value set to the second value to the first value in accordance with power supplied during a period that the upper limit value of the power is set to the second value.

The respective steps will be described below.

Step S2-1

The control circuitry 42 determines whether the imaging is being continued, or has been finished. Specifically, if the imaging is being continued, the next process is step S2-2. If the imaging has been finished, the serial operation relating to the magnetic resonance imaging exits the loop of the process of the second phase, and is terminated. In the meantime, alternatively or in a parallel manner, the processing circuitry 20 may be implemented so as to determine the continuation/end of the imaging by reading out and executing a predetermined program stored in the memory circuitry 21. At the time of termination, the control circuitry 42 stops the integration of the output currents which are output from the AC/DC converter 40. The control circuitry 42 reset the boost use time to 0 (step S2-1a).

Step S2-2

The control circuitry 42 compares, in the monitoring, the output current which is output from the AC/DC converter 40, with the current threshold $I_1$, and determines whether the output current of the AC/DC converter 40 exceeds the current threshold $I_1$. Specifically, if the output current of the AC/DC converter 40 exceeds the current threshold $I_1$, the next process is step S2-3. If the output current of the AC/DC converter 40 does not exceed the current threshold $I_1$, the next process is step S2-1. In other words, in the present step, it is determined whether the output current exceeds the current threshold $I_1$ or not. Incidentally, in the present step, it may be determined whether the output power exceeds the power threshold $P_1$ or not.

Step S2-3

As regards the limitation of the output power or output current of the AC/DC converter 40, the control circuitry 42 determine whether the present mode is the normal mode or the boost mode. As regards the limitation of the output current of the AC/DC converter 40, if it is determined that the present mode is the normal mode, the next process is step S2-4. In addition, as regards the limitation of the output current of the AC/DC converter 40, if it is determined that the present mode is the boost mode, the next process is step S2-5.

Step S2-4

The control circuitry 42 changes the normal mode to the boost mode. Further, the control circuitry 42 start the integration of the output current flowing from the AC/DC converter 40, the calculation of a duration-time mean value of the output current, and the integration of the boost use time. Then, the process of step S2-5 is executed. The integration of the boost use time corresponds to a duration of time during which the current exceeding the current threshold $I_1$ is supplied to the gradient coil 51, or a duration of time during which the power exceeding the power threshold $P_1$ is supplied to the gradient coil 51. The control circuitry 42 calculate, as a reference value, at least one of an integrated value of a power index value (output current or output power) in the duration of time, a mean value of the power index value, and the duration of time. At this time, calculation means is realized as a calculation function relating to the above-described calculation of the control circuitry 42. For example, the control circuitry 42 calculates the reference value of power supply during a period in which the upper limit value is set to the second value. The reference value is at least one of a duration of time when the upper limit value is set to the second value, an integrated value of the power during the time, and a mean value of the power during the period in which the upper limit value of the power is set to the second value.

Step S2-5

The control circuitry 42 compare the duration-time mean value of the output current, which flows from the AC/DC converter 40, and the current threshold $I_1$, and determine whether the duration-time mean value of the output current of the AC/DC converter 40 exceeds the current threshold $I_1$. If the duration-time mean value of the output current of the AC/DC converter 40 exceeds the current threshold $I_1$, the next process is step S2-7. If the duration-time mean value of the output current of the AC/DC converter 40 does not exceed the current threshold the next process is step S2-6.

Step S2-6

The control circuitry 42 reset to 0 each of the integrated value of the output current flowing from the AC/DC converter 40, the duration-time mean value of the output current, and the integrated value of the boost use time, the calculation of which was started in step S2-4.

Step S2-7

The control circuitry 42 compare the integrated value of the boost use time and an allowable time T, and determine whether the integrated value of the boost use time exceeds the allowable time T or not. If the integrated value of the boost use time exceeds the allowable time T, the next process is step S2-9. If the integrated value of the boost use time does not exceed the allowable time T, the next process is step S2-8.

Step S2-8

The control circuitry 42 compare the integrated value of the output current flowing from the AC/DC converter 40 and an integration current threshold Q, and determine whether the integrated value of the output current flowing from the AC/DC converter 40 exceeds the integration current threshold Q. If the integrated value of the output current flowing from the AC/DC converter 40 exceeds the integration current threshold Q, the next process is step S2-9. If the integrated value of the output current flowing from the AC/DC converter 40 does not exceed the integration current threshold Q, the next process is step S2-1.

Step S2-9

The control circuitry 42 changes the boost mode to the normal mode. At this time, the next process is a third phase. In other words, if step S2-7 and step S2-8 are also referred to, the control circuitry 42 change the boost mode to the normal mode, upon being triggered by an event in which the integrated value of the boost use time exceeds the allowable time T, or an event in which the integrated value of the output current flowing from the AC/DC converter 40 exceeds the integration current threshold Q (boost mode restriction function).

Third Phase

Steps S3-1 to S3-3 in FIG. 4C illustrate a third phase relating to the boost control function, the third phase being a phase during the imaging. As will be described later, the third phase includes a loop process. In the third phase, too, the control circuitry 42, as monitoring means, monitor, with a higher time resolution than the processing circuitry 20, the output currents which are output from the AC/DC converter 40, and the output currents which are output from the Xch amplifier circuitry 411, Ych amplifier circuitry 412 and Zch amplification circuitry 413 in the amplifier circuitry 41. In addition, based on the monitoring result, the control circuitry 42 executes, where necessary, various small functions relating to the boost control function. The respective steps will be described below.

Step S3-1

The control circuitry 42 determines whether the imaging is being continued, or has been finished. If the imaging is being continued, the next process is step S3-2. If the imaging has been finished, the serial operation relating to the magnetic resonance imaging exits the loop of the process of the third phase, and is terminated. In the meantime, alternatively or in a parallel manner, the processing circuitry 20 may be implemented so as to determine the continuation/end of the imaging by reading out and executing a predetermined program stored in the memory circuitry 21. At the time of termination, the control circuitry 42 stop the integration of the output currents which are output from the AC/DC converter 40. The control circuitry 42 reset the boost use time to 0 (step S3-1a).

Step S3-2

The control circuitry 42 compare the duration-time mean value of the output current, which flows from the AC/DC converter 40, and the current threshold $I_1$, and determine whether the duration-time mean value of the output current of the AC/DC converter 40 exceeds the current threshold $I_1$. If the duration-time mean value of the output current of the AC/DC converter 40 exceeds the current threshold $I_1$, the next process is step S3-1. If the duration-time mean value of the output current of the AC/DC converter 40 does not exceed the current threshold the next process is step S3-3.

Step S3-3

The control circuitry 42 reset to 0 each of the integrated value of the output current flowing from the AC/DC converter 40, the duration-time mean value of the output current, and the integrated value of the boost use time, the calculation of which was started in step S2-4. At this time, the next process returns to the second phase.

Next, a description is given of an operation example of the boost control function of the magnetic resonance imaging apparatus 1 according to the embodiment.

Figure 5:
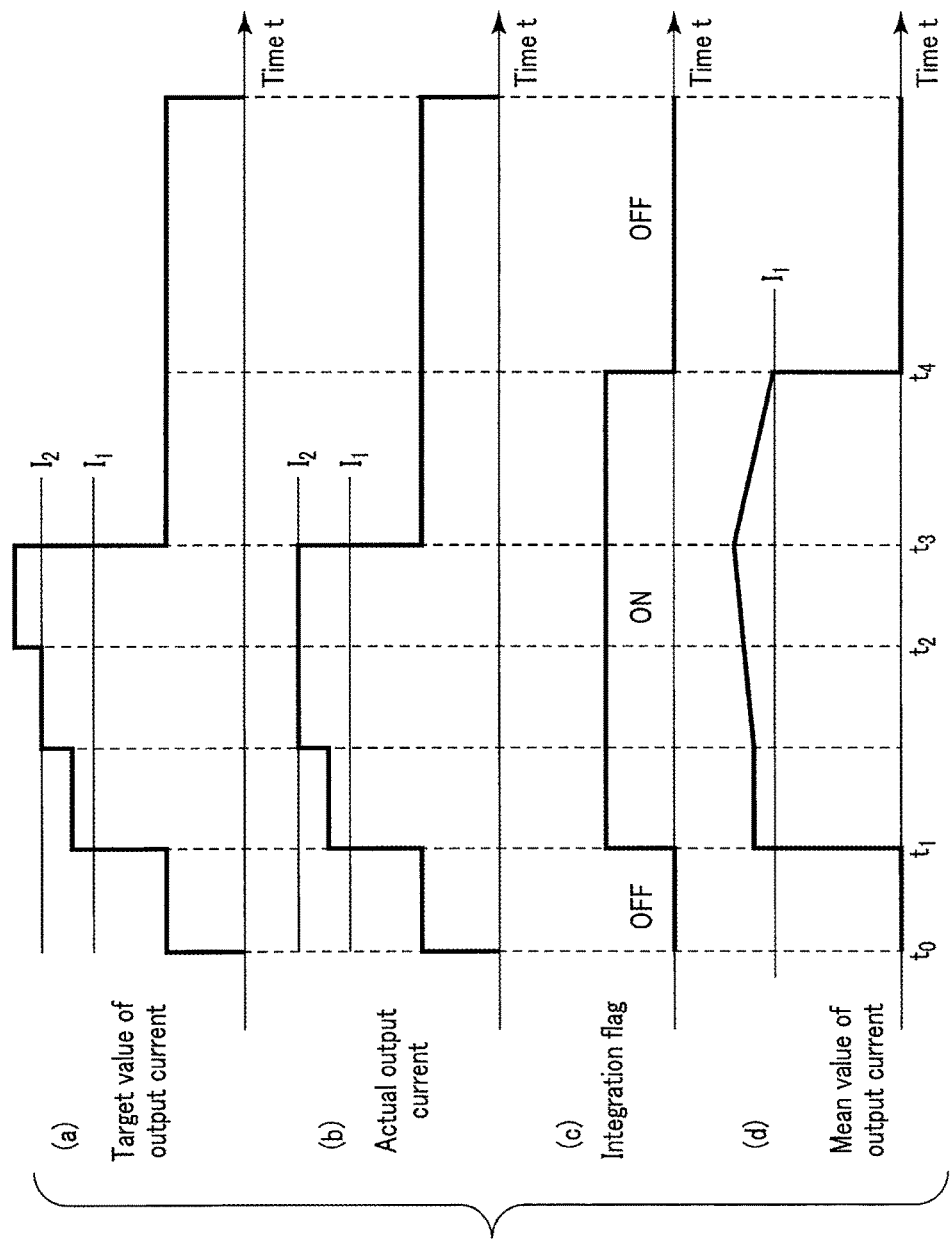
FIG. 5 is a timing chart illustrating an example (second phase) of the operation of the boost control function in connection with the magnetic resonance imaging apparatus according to the embodiment.

FIG. 5 is a timing chart illustrating an example (second phase) of the operation of the boost control function in connection with the magnetic resonance imaging apparatus 1 according to the embodiment.

Part (a) of FIG. 5 illustrates a timing chart of a target value of an output current which is output from the AC/DC converter 40. Part (b) of FIG. 5 illustrates a timing chart of an actual output current which is output from the AC/DC converter 40. Part (c) of FIG. 5 illustrates a timing chart of the ON/OFF of an integration flag. Part (d) of FIG. 5 illustrates a timing chart of a duration-time mean value of the output current which is output from the AC/DC converter 40.

As illustrated in FIG. 5, during a period between time $t_0$ and time $t_1$, the target value of the output current is lower than the current threshold $I_1$. Accordingly, the AC/DC converter 40 outputs a current of the same value as the target value. Since the actual output current during the period between time $t_0$ and time $t_1$ is less than the current threshold $I_1$, the boost mode is not executed. The mode at this time is the normal mode. In addition, since the actual output current during the period between time $t_0$ and time $t_1$ is less than the current threshold $I_1$, the duration-time mean value of the output current is not calculated.

During a period between time $t_1$ and time $t_2$, the target value of the output current is higher than the current threshold $I_1$ and is not higher than the current threshold $I_2$. The control circuitry 42 executes the boost mode at time $t_1$. During the period between time $t_1$ and time $t_2$, by the boost mode being executed, the AC/DC converter 40 output a current with a value which is higher than the current threshold $I_1$ and is not higher than the current threshold $I_2$ and which is equal to the target value of the output current. Upon being triggered by the event in which the boost mode is executed by the control circuitry 42 at time $t_1$, the control circuitry 42 set an integration flag in the ON state, which execute the integration of the output current and the integration of the boost use time. Specifically, in the period between time $t_1$ and time $t_2$, during which the integration flag is ON, the control circuitry 42 calculate the duration-time mean value of the output current which is output from the AC/DC converter 40.

During a period between time $t_2$ and time $t_3$, the target value of the output current is higher than the current threshold $I_2$. The control circuitry 42 limit the output current, which is output from the AC/DC converter 40, to the current threshold $I_2$. During the period between time $t_2$ and time $t_3$, the AC/DC converter 40 outputs the current of the current threshold $I_2$, which is lower than the target value of the output current.

In the meantime, also in the period between time $t_2$ and time $t_3$, during which the integration flag is ON, the control circuitry 42 calculate the duration-time mean value of the output current which is output from the AC/DC converter 40.

During a period between time $t_3$ and time $t_4$, the target value of the output current is lower than the current threshold $I_1$. Accordingly, during the period between time $t_3$ and time $t_4$, the AC/DC converter 40 outputs a current of the same value as the target value. At this time, the boost function is not used.

In the meantime, also in the period between time $t_3$ and time $t_4$, during which the integration flag is ON, the control circuitry 42 calculate the duration-time mean value of the output current which is output from the AC/DC converter 40. In addition, at time $t_4$, upon being triggered by an event in which the duration-time mean value of the output current reaches $I_1$, the control circuitry 42 set the integration flag in the OFF state. Alternatively, at time $t_4$, upon being triggered by an event in which the duration-time mean value of the output current lowers below $I_1$, the control circuitry 42 may set the integration flag in the OFF state. In addition, upon being triggered by this state, the control circuitry 42 reset to 0 each of the integrated value of the output current flowing from the AC/DC converter 40, the duration-time mean value of the output current, and the integrated value of the boost use time.

Figure 6:
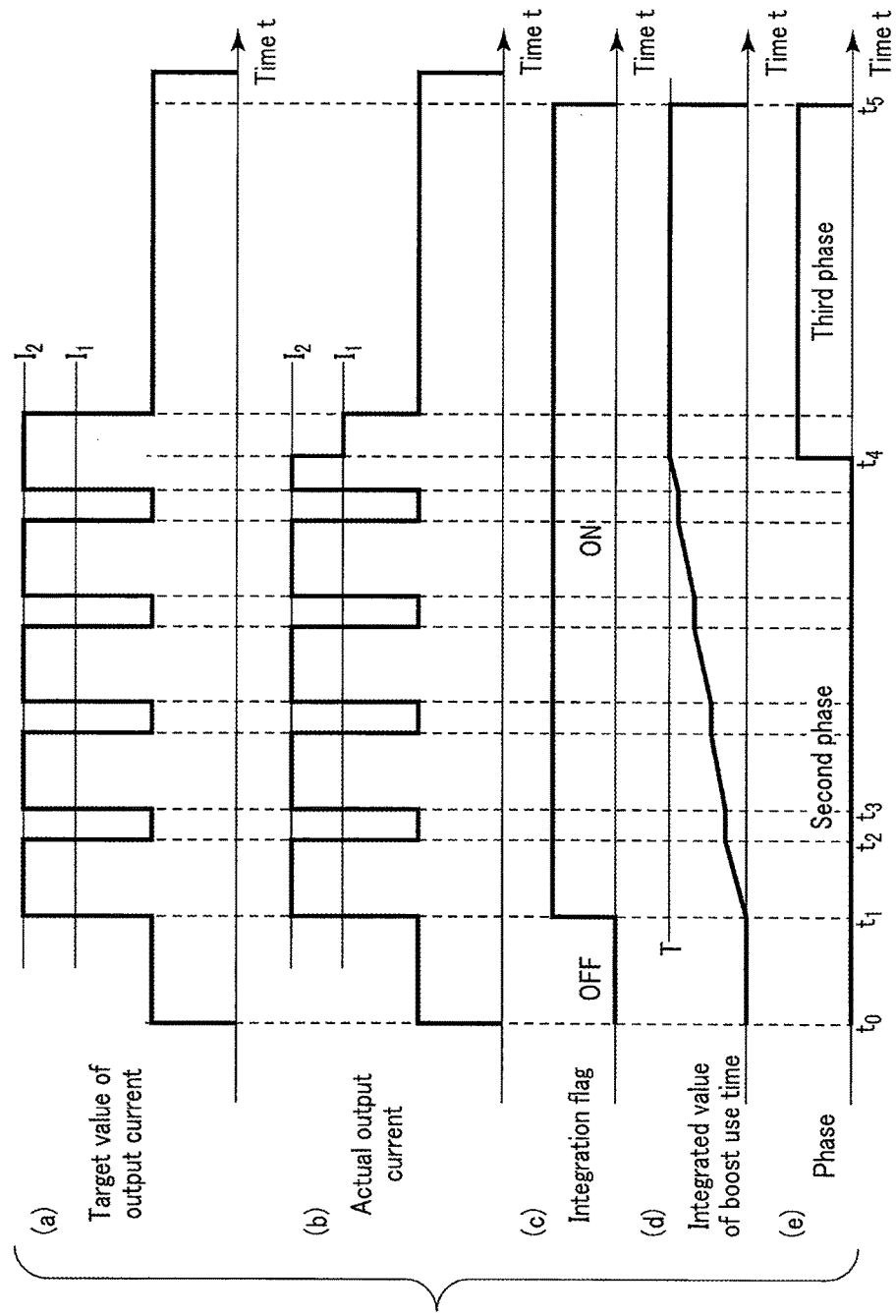
FIG. 6 is a timing chart illustrating an example (second phase and third phase) of the operation of the boost control function in connection with the magnetic resonance imaging apparatus according to the embodiment.

FIG. 6 is a timing chart illustrating an example (second phase and third phase) of the operation of the boost control function in connection with the magnetic resonance imaging apparatus 1 according to the embodiment.

Part (a) of FIG. 6 illustrates a timing chart of a target value of an output current which is output from the AC/DC converter 40. Part (b) of FIG. 6 illustrates a timing chart of an actual output current which is output from the AC/DC converter 40. Part (c) of FIG. 6 illustrates a timing chart of the ON/OFF of an integration flag. Part (d) of FIG. 6 illustrates a timing chart of an integrated value of the boost use time. Part (e) of FIG. 6 illustrates a timing chart of the phase (second phase or third phase) in the boost control function.

As illustrated in FIG. 6, during a period between time $t_0$ and time $t_1$, the target value of the output current is lower than the current threshold $I_1$. Accordingly, the AC/DC converter 40 outputs a current of the same value as the target value. Since the actual output current during the period between time $t_0$ and time $t_1$ is less than the current threshold $I_1$, the boost mode is not executed. The mode at this time is the normal mode.

During a period between time $t_1$ and time $t_2$, the target value of the output current is higher than the current threshold $I_1$ and is not higher than the current threshold $I_2$. In this operation example, for the purpose of simplicity, FIG. 6 illustrates that the target value of the output current is equal to the current threshold $I_2$. The control circuitry 42 executes the boost mode at time $t_1$. During the period between time $t_1$ and time $t_2$, by the boost mode being executed, the AC/DC converter 40 outputs a current with a value which is higher than the current threshold $I_1$ and is not higher than the current threshold $I_2$ and which is equal to the target value of the output current. Upon being triggered by the event in which the boost mode is executed by the control circuitry 42 at time $t_1$, the control circuitry 42 set the integration flag in the ON state, which executes the integration of the output current and the integration of the boost use time. In addition, during the period between time $t_1$ and time $t_2$, the integration of the boost use time is executed.

During a period between time $t_2$ and time $t_3$, the target value of the output current is lower than the current threshold $I_1$. Accordingly, the AC/DC converter 40 outputs a current of the same value as the target value. In addition, the actual output current during the period between time $t_2$ and time $t_3$ is less than the current threshold $I_1$. Thus, the boost function is not executed, nor is the integration of the boost use time executed.

During a period between time $t_3$ and time $t_4$, a period in which the target value of the output current is higher than the current threshold $I_1$ and is not higher than the current threshold $I_2$, and a period in which the target value of the output current is lower than the current threshold $I_1$, are alternately repeated. In accordance with this, the AC/DC converter 40 outputs a current of the same value as the target value of the output current. In addition, in the period in which the target value of the output current is higher than the current threshold $I_1$ and is not higher than the current threshold $I_2$, the boost function is executed, and the integration of the boost use time is executed. In the period in which the target value of the output current is lower than the current threshold $I_1$, the boost function is not executed, nor is the integration of the boost use time executed.

At time $t_4$, the integrated value of the boost use time reaches an allowable time T. Upon being triggered by this state, the third phase, which follows the loop process of the second phase, is executed. In addition, as described above, in the third phase, the upper limit of the output current, which is output from the AC/DC converter 40, is limited to the current threshold $I_1$. For example, at time $t_4$, when the reference value reaches a predetermined threshold, the control circuitry changes the upper limit value from the second value to the first value and controls the upper limit value not to be changed to the second value.

At time $t_5$, for example, upon being triggered by an event in which the mean value of the output current, which is output from the AC/DC converter 40, lowers below the current threshold $I_1$, the second phase is executed once again after the loop process of the third phase. In addition, upon being triggered by this state, the control circuitry 42 sets the integration flag in the OFF state, which executes the integration of the output current and the integration of the boost use time. Furthermore, upon being triggered by this state, the control circuitry 42 resets to 0 each of the integrated value of the output current flowing from the AC/DC converter 40, the duration-time mean value of the output current, and the integrated value of the boost use time. For example, at time $t_4$, the control circuitry 42 stops limiting the upper limit to the second value when the mean value of the power is below the first value.

The magnetic resonance imaging apparatus 1 according to the embodiment includes the plural gradient coils 51; the AC/DC converter 40, amplifier circuitry 41, etc., which realize the power supply circuitry 7; and the control circuitry 42 which realizes the monitoring means and upper limit value control means. The gradient coils 51 generate gradient magnetic fields. The AC/DC converter 40, amplifier circuitry 41, etc., supply power to the gradient coils. The control circuitry 42 realizes the monitoring function by monitoring at least one power index value corresponding to the power which is supplied to the gradient coils. The control circuitry 42, which realizes the upper limit value control means, execute, based on the power index value, the control to change the upper limit of power, which is supplied to the gradient coils 51, from the first value to the second value which is higher than the first value.

Thereby, the AC/DC converter 40 can temporarily supply a large power to each amplifier circuitry 41. Specifically, the gradient power supply apparatus 4 can temporarily output large current pulses. Besides, the gradient power supply apparatus 4 can temporarily output large current pulses to the plural axis coils which correspond to the plural channels.

The magnetic resonance imaging apparatus 1 according to the embodiment further includes the control circuitry 42 which realizes the calculation means. The control circuitry 42, which realizes the calculation means, calculate, as the reference value, at least one of the duration of time during which the current exceeding the predetermined threshold is supplied, the integrated value of the current during the duration of time, and the mean value of the current. In addition, upon being triggered by an event in which the reference value reaches the predetermined threshold, the control circuitry 42, which realizes the upper limit value control means, execute the control to lower the upper limit of the supply current, which has been temporarily raised. The control circuitry 42 can execute the control, based on the power in place of the current.

Thereby, the boost mode does not continue to function beyond the allowable range of the gradient power supply apparatus 4. It is thus possible to prevent a fault due to excessive use of the boost mode function.

First Modification of the Embodiment

As described above, the gradient power supply apparatus 4 in the magnetic resonance imaging apparatus 1 according to the embodiment includes the boost control function. In particular, in the above description, it is assumed that, in the first phase relating to the boost control function, when "optimization" is determined, the processing circuitry 20 executes the optimization process. However, the restriction to this example is unnecessary. For example, even when the input imaging condition is "proper", the magnetic resonance imaging apparatus 1 may be implemented such that the processing circuitry 20 executes the optimization.

As described above, the gradient power supply apparatus 4 in the magnetic resonance imaging apparatus 1 according to the embodiment includes the boost control function. In particular, in the second phase and third phase relating to the boost control function, the control circuitry 42, which realizes the upper limit value control means, change the boost mode to the normal mode, upon being triggered by an event in which the integrated value of the boost use time exceeds the allowable time T, or an event in which the integrated value of the output current flowing from the AC/DC converter 40 exceeds the integration current threshold Q (boost mode restriction function). However, the control circuitry 42, which realizes the upper limit value control means, may be implemented so as to change the boost mode to the normal mode, upon being triggered by the event in which the integrated value of the boost use time exceeds the allowable time T. The control circuitry 42, which realizes the upper limit value control means, may be implemented so as to change the boost mode to the normal mode, upon being triggered by the event in which the integrated value of the output current flowing from the AC/DC converter 40 exceeds the integration current threshold Q. Alternatively, the control circuitry 42, which realizes the upper limit value control means, may be implemented so as to change the boost mode to the normal mode, upon being triggered by the event in which the integrated value of the boost use time exceeds the allowable time T, and the event in which the integrated value of the output current flowing from the AC/DC converter 40 exceeds the integration current threshold Q.

As described above, the magnetic resonance imaging apparatus 1 according to the embodiment includes the gradient power supply apparatus 4, and the gradient power supply apparatus 4 includes the boost control function. However, the gradient power supply apparatus 4 may be implemented as an independent device. In such a case, the gradient power supply apparatus 4 is implemented so as to have the boost control function, etc.

As described above, the magnetic resonance imaging apparatus 1 according to the embodiment includes the normal mode in which the output power from the AC/DC converter 40 is limited to the power threshold $P_1$, and the boost mode in which the output power from the AC/DC converter 40 is limited to the power threshold $P_2$ which is higher than the power threshold $P_1$. In the meantime, the normal mode may be a mode in which the output current from the AC/DC converter 40 is limited to the current threshold $I_1$. At this time, the boost mode corresponds to a mode in which the output current from the AC/DC converter 40 is limited to the current threshold $I_2$ which is higher than the current threshold $I_1$. However, the restriction to these two modes is unnecessary, and the implementation of three or modes is possible. In such a case, it is preferable to adopt such implementation that power thresholds or current thresholds corresponding to the respective modes are provided.

As described above, the magnetic resonance imaging apparatus 1 according to the embodiment includes the gradient power supply apparatus 4, and the gradient power supply apparatus 4 includes the boost control function. In addition, in association with the boost control function, the control circuitry 42, which realizes the monitoring means, monitor the output current, which is output from the AC/DC converter 40, as the power index value. However, the restriction to this example is unnecessary. For example, the AC/DC converter 40 may be implemented so as to monitor the power value itself as the power index value. Alternatively, the control circuitry 42 functioning as the monitoring means may be implemented so as to monitor the voltage value as a power index value relating to the AC/DC converter 40.

The structural components of the magnetic resonance imaging apparatus 1 according to the embodiment are realized by properly combining, mainly, at least circuits, circuitry, processors and a memory.

The processor means, for example, a CPU (Central Processing Unit), a GPU (Graphics Processing Unit), or a circuitry such as an ASIC (Application Specific Integrated Circuit), or a programmable logic device (e.g. SPLD (Simple Programmable Logic Device), CLPD (Complex Programmable Logic Device), FPGA (Field Programmable Gate Array)). The processor realizes functions by reading out and executing programs stored in the memory circuitry 21. In the meantime, instead of storing programs in the memory circuitry 21, such a configuration may be adopted that programs are directly incorporated in the circuitry in the processor. In this case, the processor realizes functions by reading out and executing programs stored in the circuitry. Each of the processors in the embodiment may not be configured as a single circuit for each processor. A plurality of independent circuits may be constructed as a single processor, and the functions of the processor may be realized. Furthermore, a plurality of structural elements may be integrated in a single processor, and the functions of the processor may be realized.

The magnetic resonance imaging apparatus 1 according to the embodiment includes a plurality of gradient coils which generate gradient magnetic fields; the power supply circuitry 7 which supplies power to each of the gradient coils; the monitoring means for monitoring at least one power index value corresponding to the power; and the upper limit control means for executing control to change, based on the power index value, the upper limit of the power from the first value to the second value which is higher than the first value.

Thereby, a distortion of the current waveform can be suppressed. It is possible to prevent artifacts or blur from occurring in an acquired magnetic resonance imaging image. It is possible to suppress occurrence of an output halt due to power deficiency.

Second Modification of the Embodiment

In the control circuitry 42 in the present modification, the temperature of the power supply circuitry 7 is calculated based on the power which is supplied by the power supply circuitry 7 to the gradient coil 51. In addition, when the temperature reaches a first temperature threshold, the control circuitry 42 changes the upper limit value from the second value to the first value. At this time, the control circuitry 42 controls the upper limit value not to be changed to the second value. Furthermore, when the temperature reaches a second temperature threshold lower than the first temperature threshold, the control circuitry 42 stops limiting the upper limit to the second value. In the present modification, the temperature state of the power supply circuitry 7, together with the first value and the second value, is displayed in a predetermined display mode.

The memory circuitry 21 stores a first temperature threshold, a second temperature threshold, a temperature calculation program, a predetermined display mode, and a time-based variation of calculated temperatures. The first temperature threshold is a temperature threshold at which the continuation of the boost mode is stopped, and the boost mode is made to transition to the normal mode. The second temperature threshold is a temperature threshold (first temperature threshold>second temperature threshold) at which, during the normal mode, a transition from the normal mode to the boost mode becomes possible. The predetermined display mode is, for example, an analog-display indicator by a bar graph. In the above display mode, the temperature state of the power supply circuitry 7 may be displayed by hues corresponding to temperatures. Hereinafter, for the purpose of easier understanding, a description is given on the assumption that the predetermined display mode is a bar graph.

The temperature calculation program is a program which calculates the temperature of the power supply circuitry 7, based on the power which is supplied by the power supply circuitry 7 to the gradient coil 51. Specifically, the temperature calculation program is a program which calculates the temperature of the power supply circuitry 7, based on the power which is supplied from the power supply circuitry 7 to the gradient coil 51, a conversion formula for converting the power to temperatures, and a time constant representative of a temperature variation of the power supply circuitry 7. In the meantime, the temperature of the power supply circuitry 7 may be calculated based on the reference value, time constant and conversion formula. In addition, the memory circuitry 21 may store, in place of the temperature calculation program, a conversion table for converting the power to the temperature of the power supply circuitry 7.

The display circuitry 71 displays, during imaging, the calculated temperature as an index on the bar graph. At this time, the display circuitry 71 displays the indices corresponding to the first temperature threshold and second temperature threshold, such that these indices are fixed on the bar graph. Incidentally, the calculated temperature, first temperature threshold and second temperature threshold may be displayed as numerical values in the vicinity of the bar graph. The display circuitry 71 may display a time-based variation of previously calculated temperatures, in accordance with the operator's instruction through the input interface circuitry 70. In addition, the display circuitry 71 may display a time-based variation of previously calculated temperatures, at a time of maintenance of the present magnetic resonance imaging apparatus 1, or at a time of the occurrence of a trouble.

Hereinafter, a description is given of various processes which are additionally executed in the present modification in the first phase, second phase and third phase of the present embodiment.

First Phase

In step S1-2 of FIG. 4A, the control circuitry 42 executes the temperature calculation program, and calculate the temperature of the power supply circuitry 7, based on the estimated output power and the time constant. At this time, if the calculated temperature is less than the first temperature threshold and the imaging can be started without changing the imaging condition, the control circuitry 42 that realizes the determination function determines "proper". In the process of step S1-3, the control circuitry 42 calculates the temperature of the power supply circuitry 7 by the temperature calculation program. The control circuitry 42 outputs the calculated temperature to the memory circuitry 21 and display circuitry 71.

Second Phase

In step S2-3 of FIG. 4B, the control circuitry 42 determines whether the calculated temperature is not higher than the second temperature threshold. If the calculated temperature is not higher than the second temperature threshold, and the present mode is not the boost mode (No in step S2-3), the control circuitry 42 executes the process of step S2-4. After the process of step S2-4 of FIG. 4B, or in the case of "Yes" in step S2-3, the control circuitry 42 determines whether the calculated temperature is not less than the first temperature threshold. If the calculated temperature is less than the first temperature threshold, the control circuitry 42 executes the process of step S2-5. If the calculated temperature is not less than the first temperature threshold, the control circuitry 42 executes the process of step S2-9. At this time, the display circuitry 71 may display a predetermined alert.

Third Phase

In step S3-1 of FIG. 4C, if the calculated temperature exceeds the second temperature threshold, the control circuitry 42 continues the imaging in the normal mode. If the calculated temperature is not higher than the second temperature threshold, the control circuitry 42 executes the process of step S3-2.

According to the present modification, the following advantageous effects can be obtained in addition to the advantageous effects of the present embodiment.

According to the magnetic resonance imaging apparatus 1 of the present modification, the temperature of the power supply circuitry 7 can be calculated based on the power which is supplied by the power supply circuitry 7 to the gradient coil 51. In addition, when the temperature reaches a first temperature threshold, it is possible to change the upper limit value from the second value to the first value, and to control the upper limit value not to be changed to the second value. Furthermore, when the temperature reaches a second temperature threshold lower than the first temperature threshold, it is possible to stop limiting the upper limit to the second value. The temperature state of the power supply circuitry 7, together with the first value and the second value, can be displayed in real time in the predetermined display mode.

From the above, according to the present magnetic resonance imaging apparatus 1, during the period of imaging, etc., the variation of the temperature of the power supply circuitry 7, together with the first temperature threshold and second temperature threshold, can visually be presented to the operator. Thereby, the operator can easily visually recognize the temperature state of the power supply circuitry 7.

Third Modification of the Embodiment

Power supply circuitry 7 in the present modification is provided with a temperature measuring sensor which measures the temperature of the power supply circuitry 7. The temperature measured by the temperature measuring sensor, together with the first temperature threshold and second temperature threshold, is displayed in a predetermined display mode.

By the control circuitry 42 of the present modification, when the measured temperature reaches the first temperature threshold, the upper limit value set to the second value is changed to the first value and is controlled not to be changed to the second value. Furthermore, when the temperature reaches a second temperature threshold lower than the first temperature threshold, the control circuitry 42 stops limiting the upper limit to the second value.

FIG. 7 is a block diagram illustrating the configuration of a gradient power supply apparatus 4 in the present modification. In FIG. 7, solid-line arrows indicate power lines, double-line arrows indicate output lines, and broken-line arrows indicate communication signal lines.

A temperature measuring sensor 80 measures the temperature of the power supply circuitry 7. The temperature measuring sensor 80 is provided adjacent to the AC/DC converter 40. The temperature measuring sensor 80 outputs the measured temperature to the control circuitry 42. Incidentally, the temperature measuring sensor 80 may be provided adjacent to the amplifier circuitry 41. In addition, the temperature measuring sensor 80 may be provided for each of the Xch amplifier circuitry 411, Ych amplifier circuitry 412 and Zch amplifier circuitry 413. When a DC/DC converter is provided between the AC/DC converter 40 and the amplifier circuitry 41, the temperature measuring sensor 80 is provided adjacent to the DC/DC converter. At this time, the target of control by the control circuitry 42 becomes the DC/DC converter.

The memory circuitry 21 stores the measured temperature. The memory circuitry 21 stores a program which realizes the boost control function using the measured temperature.

Hereinafter, a description is given of processes, which are different from those in the embodiment, in the second phase and third phase of the present modification. In the present modification, unlike the second modification, the temperature of the power supply circuitry 7 is directly measured. Thus, the process of step S2-5 to step S2-8 in FIG. 4B and the process of step S3-3 in FIG. 4C are omitted. In the meantime, in a case of further using the measured temperature in addition to the boost control function of the embodiment, this case can be explained by reading the "temperature", which is used in various processes in the second modification, as the "measured temperature", so a description of this case is omitted here.

Second Phase

Prior to the process of step S2-1 in FIG. 4B, with the start of imaging, the measurement of the temperature of the power supply circuitry 7 is started. In step S2-1a, the measurement of the temperature is finished. In step S2-3, the control circuitry 42 determines whether the measured temperature is not higher than the second temperature threshold. If the measured temperature is not higher than the second temperature threshold, and the present mode is not the boost mode (No in step S2-3), the control circuitry 42 changes the normal mode to the boost mode as the process of step S2-4. After the process of step S2-4 of FIG. 4B, or in the case of "Yes" in step S2-3, the control circuitry 42 determines whether the measured temperature is not less than the first temperature threshold. If the measured temperature is less than the first temperature threshold, the control circuitry 42 executes the process of step S2-1. If the measured temperature is not less than the first temperature threshold, the control circuitry 42 executes the process of step S2-9.

Third Phase

If the imaging is finished (Yes in step S3-1 in FIG. 4C), the measurement of the temperature is ended as the process of step S3-1a. In step S3-2, it is determined whether the measured temperature is not higher than the second temperature threshold. If the measured temperature exceeds the second temperature threshold (No in step S3-2), the control circuitry 42 executes the process of step S3-1. If the measured temperature is not higher than the second temperature threshold (Yes in step S3-2), the control circuitry 42 executes the process of step S2-1 of the second phase.

According to the magnetic resonance imaging apparatus 1 of the present modification, the temperature of the power supply circuitry 7 can be measured. Thereby, the same advantageous effects as in the second modification can be obtained.

The magnetic resonance imaging apparatuses 1 and gradient power supply apparatuses 4 according to the above-described embodiment and modifications can be adaptive to various imaging conditions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
a gradient coil configured to generate a gradient magnetic field;
power supply circuitry configured to supply power to the gradient coil, the power being required by the gradient coil; and
control circuitry configured to temporarily change an upper limit value of power to be supplied by the power supply circuitry to a second value higher than a first value as a rated value based on the power required by the gradient coil,
wherein the control circuitry is further configured to calculate a reference value of power supply during a period in which the upper limit value is set to the second value, the reference value being at least one of a duration of time when the upper limit value is set to the second value, an integrated value of the power during the time, and a mean value of the power during the period in which the upper limit value of the power is set to the second value.

2. The magnetic resonance imaging apparatus according to claim 1, wherein the control circuitry is further configured to change the upper limit value set to the second value to the first value in accordance with power supplied during a period that the upper limit value of the power is set to the second value.

3. The magnetic resonance imaging apparatus according to claim 1, wherein the control circuitry is further configured to monitor the power to be supplied by the power supply circuitry, and power to be supplied to at least one of a plurality of axis coils, the axis coils being included by the gradient coil.

4. The magnetic resonance imaging apparatus according to claim 1, wherein the control circuitry is further configured to change the upper limit value from the second value to the first value when the reference value reaches a predetermined threshold, and control the upper limit value not to be changed to the second value.

5. The magnetic resonance imaging apparatus according to claim 4, wherein the control circuitry is further configured to stop limiting the upper limit to the second value when the mean value of the power is below the first value.

6. The magnetic resonance imaging apparatus according to claim 1, wherein the control circuitry is further configured to:
calculate a temperature of the power supply circuitry based on the power supplied to the gradient coil by the power supply circuitry;
change the upper limit value from the second value to the first value when the temperature reaches a first temperature threshold, and control the upper limit value not to be changed to the second value, and
stop limiting the upper limit to the second value when the temperature reaches a second temperature threshold lower than the first temperature threshold, and
the magnetic resonance imaging apparatus further comprises display circuitry configured to display the temperature, together with the first temperature threshold and the second temperature threshold.

7. The magnetic resonance imaging apparatus according to claim 1, further comprising processing circuitry configured to estimate, based on an imaging condition, prior to starting imaging, at least one of the power required by the gradient coil, a time when the upper limit value is permitted to be changed, and the duration of time.

8. The magnetic resonance imaging apparatus according to claim 7, wherein the processing circuitry is further configured to control a display to display an alert based on the estimation.

9. The magnetic resonance imaging apparatus of claim 7, wherein the processing circuitry is further configured to optimize an imaging sequence related to the imaging condition based on the estimation.

10. A magnetic resonance imaging apparatus, comprising:
a gradient coil configured to generate a gradient magnetic field;
power supply circuitry configured to supply power to the gradient coil, the power being required by the gradient coil; and
control circuitry configured to temporarily change an upper limit value of power to be supplied by the power supply circuitry to a second value higher than a first value as a rated value based on the power required by the gradient coil;
a temperature measuring sensor configured to measure a temperature of the power supply circuitry; and
display circuitry configured to display the temperature, together with a first temperature threshold and a second temperature threshold lower than the first temperature threshold, wherein
the control circuitry is further configured to
change the upper limit value set to the second value to the first value when the temperature reaches the first temperature threshold, and control the upper limit value not to be changed to the second value, and stop limiting the upper limit to the second value when the temperature reaches a second temperature threshold lower than the first temperature threshold.

11. A gradient power supply apparatus, comprising:

power supply circuitry configured to supply power required by a gradient coil, the gradient coil being configured to generate a gradient magnetic field; and control circuitry configured to temporarily change an upper limit value of power from a first value as a rated value to a second value higher than the first value based on the power required by the gradient coil, the upper limit value being set by the power supply circuitry, wherein the control circuitry is further configured to calculate a reference value of power supply during a period in which the upper limit value is set to the second value, the reference value being at least one of a duration of time when the upper limit value is set to the second value, an integrated value of the power during the time, and a mean value of the power during the period in which the upper limit value of the power is set to the second value.

* * * * *